15
United States Patent
Rifani et al.

(10) Patent No.: US 7,024,324 B2
(45) Date of Patent: Apr. 4, 2006

(54) DELAY ELEMENT CALIBRATION

(75) Inventors: Michael C. Rifani, Portland, OR (US);
Keng L. Wong, Portland, OR (US);
Christopher Pan, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 24 days.

(21) Appl. No.: 10/856,907

(22) Filed: May 27, 2004

(65) Prior Publication Data

US 2005/0278131 A1 Dec. 15, 2005

(51) Int. Cl.
*G06F 19/00* (2006.01)
(52) U.S. Cl. .......................... 702/79; 326/93; 331/44; 714/798; 702/89; 702/106; 702/107
(58) Field of Classification Search ............... None
See application file for complete search history.

(56) References Cited

U.S. PATENT DOCUMENTS

| | | | | |
|---|---|---|---|---|
| 5,955,904 A * | 9/1999 | Kawasaki | | 327/156 |
| 6,066,969 A * | 5/2000 | Kawasaki et al. | | 327/156 |
| 6,087,868 A * | 7/2000 | Millar | | 327/156 |
| 6,121,808 A * | 9/2000 | Gaudet | | 327/231 |
| 6,137,327 A * | 10/2000 | Schnell | | 327/158 |
| 6,173,380 B1 * | 1/2001 | Jin et al. | | 711/167 |
| 6,208,169 B1 | 3/2001 | Wong | | |
| 6,269,051 B1 * | 7/2001 | Funaba et al. | | 365/233 |
| 6,330,296 B1 * | 12/2001 | Atallah et al. | | 375/376 |
| 6,337,590 B1 * | 1/2002 | Millar | | 327/158 |
| 6,417,698 B1 * | 7/2002 | Williams et al. | | 326/93 |
| 6,492,852 B1 * | 12/2002 | Fiscus | | 327/158 |
| 6,539,072 B1 * | 3/2003 | Donnelly et al. | | 375/371 |
| 6,693,473 B1 * | 2/2004 | Alexander et al. | | 327/158 |
| 6,748,549 B1 * | 6/2004 | Chao et al. | | 713/401 |
| 6,771,134 B1 * | 8/2004 | Wong et al. | | 331/57 |
| 6,778,033 B1 * | 8/2004 | Wong et al. | | 331/185 |
| 6,924,710 B1 * | 8/2005 | Wong et al. | | 331/175 |
| 2003/0071669 A1 * | 4/2003 | Liu et al. | | 327/158 |
| 2003/0197537 A1 * | 10/2003 | Saint-Laurent | | 327/165 |
| 2003/0226052 A1 * | 12/2003 | Hill et al. | | 713/400 |
| 2004/0263227 A1 * | 12/2004 | Baker et al. | | 327/158 |
| 2005/0077937 A1 * | 4/2005 | Meyer | | 327/158 |

* cited by examiner

*Primary Examiner*—Patrick J. Assouad
(74) *Attorney, Agent, or Firm*—Schwabe, Williamson & Wyatt, P.C.

(57) ABSTRACT

A method for calibrating a delay element is described herein. In some embodiments, the method may include generating a clock signal with a clock edge, generating a reference signal with a reference edge using an adjustable delay line to delay the clock signal, and delaying a selected one of the clock signal and the reference signal through an array delay line having an array delay element with an array delay. In some embodiments, the method may further include adjusting the adjustable delay line to obtain a first adjustable delay so that the clock and reference edges are aligned on one side of the array delay element, adjusting the adjustable delay line to obtain a second adjustable delay so that the clock and reference edges are aligned on the other side of the array delay element, and ascertaining a delay difference between the first and the second adjustable delays to determine a value of the array delay provided by the array delay element. Other embodiments of the present invention may include, but are not limited to, apparatuses and systems adapted to facilitate practice of the above-described method.

30 Claims, 11 Drawing Sheets

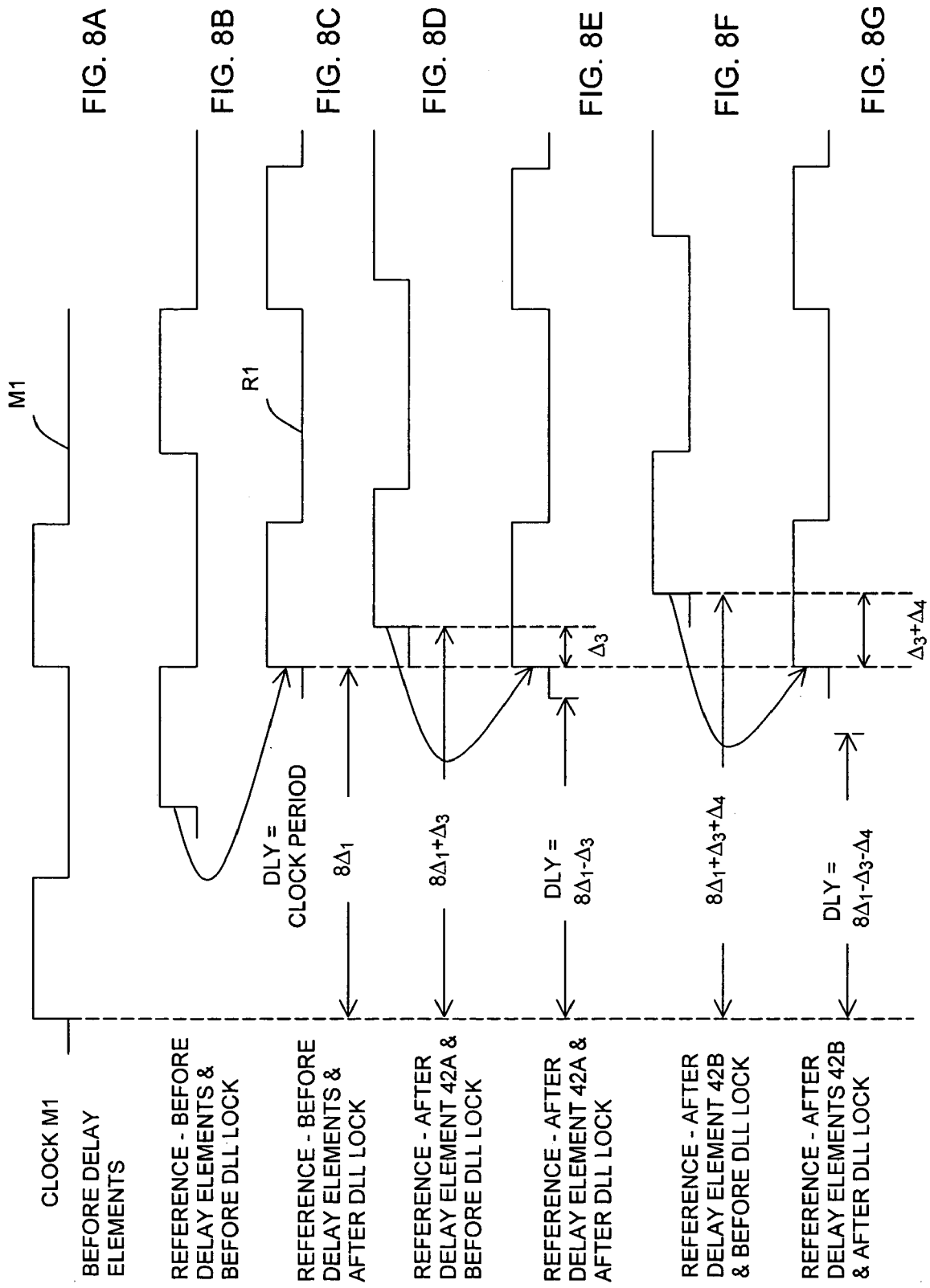

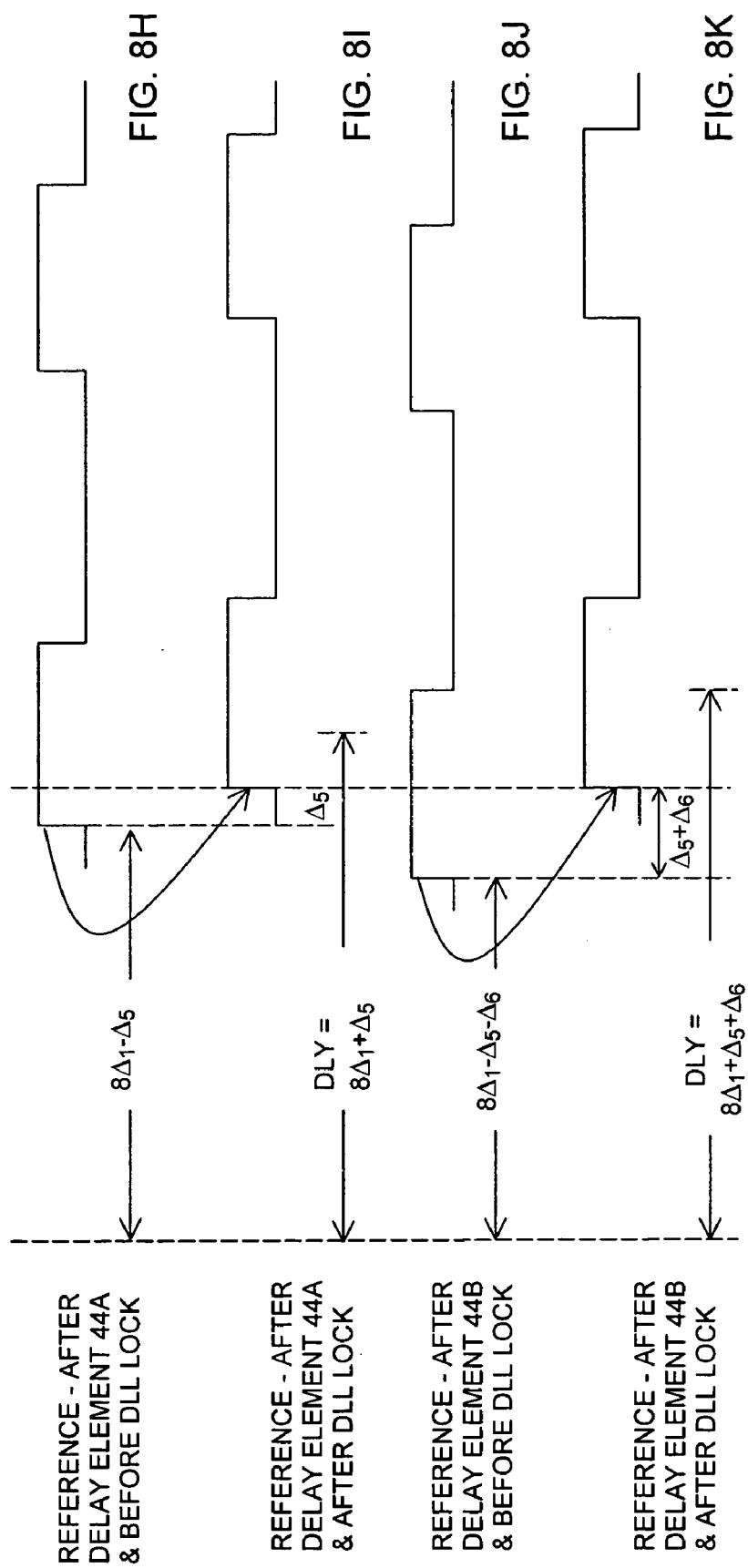

DELAY ELEMENT CALIBRATION

BACKGROUND OF THE INVENTION

1. Field of the Invention

The present invention relates to electronic devices, and in particular, to clocks for the electronic devices.

2. Description of Related Art

A conventional jitter measurement circuit 10 is shown in FIG. 1 for measuring clock jitter in an integrated circuit (IC) chip. Clock jitter refers to the temporal variation of a clock period at a given point on the chip, i.e., the clock period may reduce or expand on a cycle-by-cycle basis. The circuit 10 has a delay-locked loop (DLL) 12, which receives a clock signal M1 (or its inverted form M2 via a multiplexer 14). The DLL 12 includes a voltage-controlled delay line (VCDL) 16 having 8 adjustable, cascaded DLL delay elements 18 (two inverting half delay circuits, for example) for delaying the clock signal in increments of the adjustable delay DLY so as to generate a reference signal; a phase detector array 20 using one of a plurality of phase detectors for comparing the clock and generated reference signals to generate a phase difference indicative of the clock jitter; and a feedback path 22 responsive to the phase difference to adjust the delay through the VCDL 16 such that the rising edges of the two signals at inputs of a selected phase detector are aligned and locked. The feedback path 22 typically includes the selected phase detector of the array 20, a digital low-pass filter 24, an up/down counter 26 and a bias generator 28. A jitter recorder 30 displays the measured phase jitter. For calibration purposes, a switch 32 and a calibration reference signal generator 34 (to provide a calibration reference signal) are included.

Referring to FIG. 2, the conventional phase detector array 20 is shown. The array 20 includes 16 phase detectors 40, in the form of flip-flops, which are designated by numbers 0–15 with only phase detectors 40 with numbers 5–9 being illustrated. A first line 41, which has 8 array delay elements 42 (only delay elements 42A and 42B are shown), receives the generated/calibration reference signal (hereinafter, simply reference signal) and progressively delays the reference signal before it passes to the phase detectors with numbers 8–15. A second line 43, which has a 7 of array delay elements 44 (only elements 44A and 44B are shown), receives the clock signal and progressively delays the clock signal before it passes to the phase detectors with numbers 6–0. At phase detector identified by #7, the clock and reference signals are not delayed with respect to each other by an array delay element. By default the output of phase detector #7 is selected as the feedback signal to the low-pass filter 24 of FIG. 1; hence, the edges of the clock and reference signals are aligned on row #3. Each of the phase detectors 40 compares the reference signal to the clock signal, with varying delays between the two dictated by the array delay elements 42 and 44. Outputs of adjacent phase detectors 40 are compared by XOR logic gates 46 (with the exception of the XNOR logic gate 48) to generate phase bin output of 1 or 0, which is fed to phase bins (not shown) in the jitter recorder 30 of FIG. 1. The outputs of the logic gates 46 and 48 indicate which phase bin has received a hit.

Five illustrative Scenarios −2 through +2 are shown in five columns of FIG. 2, with Scenario 0 at the center column having no phase jitter and each Scenario on either side of the center column representing a progressively increasing amount of phase jitter in opposite directions. The rising edges of the clock and reference signals are shown with by a matrix of wiggly lines for each of the 5 Scenarios (columns) and each of the phase detectors identified by numbers 5–9 (Rows). For a given Scenario and Row, a dashed edge indicates where the rising edge would be if there was no clock jitter and a solid edge indicates where the rising edge would be with the amount of clock jitter in that Scenario. Hence, in the columns of Scenarios −1 and −2, either the clock edges (Rows 1 and 2) or reference edges (Rows 4 and 5) are progressively delayed, and in the columns of Scenarios +1 and +2 either the clock edges (Rows 1 and 2) or the reference edges (Rows 4 and 5) are progressively advanced. Outputs of 1 or 0 from the phase detectors 40 are specified under the clock edges and the outputs of 1 or 0 of the logic gates 46 and 48 are interposed in the Rows laterally to the logic gates 46 and 48. Hits received by the phase bins are shown by 1's in boxes. For example, in Scenario 0 all the outputs from the phase detectors identified by numbers 0–15 are 0 and there is a single phase bin hit in Row three, i.e., 1 output from the XNOR logic gate 48 having 0 inputs from the phase detectors identified by numbers 6 and 7. All of the other bins do not have a hit. Generally, different patterns of hits indicate or detect a range of scenarios. The scenarios illustrated in FIG. 2 are the boundary cases of each range. For example, any jitter scenario between Scenario 0 and Scenario 1 would result in a pattern whereby the XNOR logic gate 48 is the only one hit.

The pattern of bin hits is a way to detect a certain kind of Scenario, but these Scenarios are not limited to detecting amounts of clock jitter. In the prior art, the same phase detector array 20 is used for calibration. Although simulations are used to estimate the delays of the array delay elements 42 and 44, calibration is required to measure their actual values. During calibration of the phase detector array 20, the feedback path 22 is opened by the switch 32 and a calibration reference signal from the external calibration reference signal generator 34 is selected by a multiplexer 36 to be used instead of the generated reference signal from the VCDL 16. How this calibration procedure works may be illustrated by Scenario −2, Row 2 showing the output for phase detector #8 of FIG. 2 wherein the rising edges of the delayed clock signal and the reference signal are substantially aligned due to the clock jitter of Scenario (−2), unlike the relative edge positions shown in the other columns of Row 2. During calibration, an operator, in attempting to determine the delay of the array delay element 42 between phase detectors #7 and #8, varies a phase offset to the calibration reference signal from the generator 34, in a manner illustrated in the various positions of the Row #2, to accomplish the same alignment shown Scenario −2, Row #2. Upon alignment, the bin between phase detectors #8 and #9 receives a hit, which is noted by the operator. Hence, the misalignment of the clock and calibration reference signals is substantially canceled by the delay of the array delay element 42 between phase detectors #7 and #8. Hence, the known misalignment offset introduced by the operator (instead of by phase jitter) determines the delay of this array delay element 42. This procedure is repeated for each of the array delay elements 42 and 44.

The external calibration reference signal generator 34 is expensive and the calibration procedure has limited accuracy. Also, bandwidth limitations of external routings, i.e., packaging for the chip and other interconnects, degrades the external calibration reference signal.

BRIEF DESCRIPTION OF THE DRAWINGS

FIG. 8A is a timing diagram of the clock signal provided as an input to the phase detector #7 in FIG. 2 during a second phase of the calibration method, according to one method of the present invention.

FIG. 8B is a timing diagram of the reference signal before DLL lock, which is provided as an input to the phase detector #7 in FIG. 2 during the second phase of the calibration method.

FIG. 8C is a timing diagram of the reference signal after DLL lock, which is provided as an input to the phase detector #7 in FIG. 2 during the second phase of the calibration method.

FIG. 8D is a timing diagram of the reference signal before DLL lock, which is provided as an input to the phase detector #8 in FIG. 2 during the second phase of the calibration method.

FIG. 8E is a timing diagram of the reference signal after DLL lock, which is provided as an input to the phase detector #8 in FIG. 2 during the second phase of the calibration method.

FIG. 8F is a timing diagram of the reference signal before DLL lock, which is provided as an input to the phase detector #9 in FIG. 2 during the second phase of the calibration method.

FIG. 8G is a timing diagram of the reference signal after DLL lock, which is provided as an input to the phase detector #9 in FIG. 2 during the second phase of the calibration method.

FIG. 8H is a timing diagram of the reference signal before DLL lock, which is provided as an input to the phase detector #6 in FIG. 2 during the second phase of the calibration method.

FIG. 8I is a timing diagram of the reference signal after DLL lock, which is provided as an input to the phase detector #6 in FIG. 2 during the second phase of the calibration method.

FIG. 8J is a timing diagram of the reference signal before DLL lock, which is provided as an input to the phase detector #5 in FIG. 2 during the second phase of the calibration method.

FIG. 8K is a timing diagram of the reference signal after DLL lock, which is provided as an input to the phase detector #5 in FIG. 2 during the second phase of the calibration method.

DETAILED DESCRIPTION OF ILLUSTRATIVE EMBODIMENTS

In the following description, for purposes of explanation, numerous details are set forth in order to provide a thorough understanding of the disclosed embodiments of the present invention. However, it will be apparent to one skilled in the art that these specific details are not required in order to practice the disclosed embodiments of the present invention. In other instances, well-known electrical structures and circuits are shown in block diagram form in order not to obscure the disclosed embodiments of the present invention.

Figure 1:
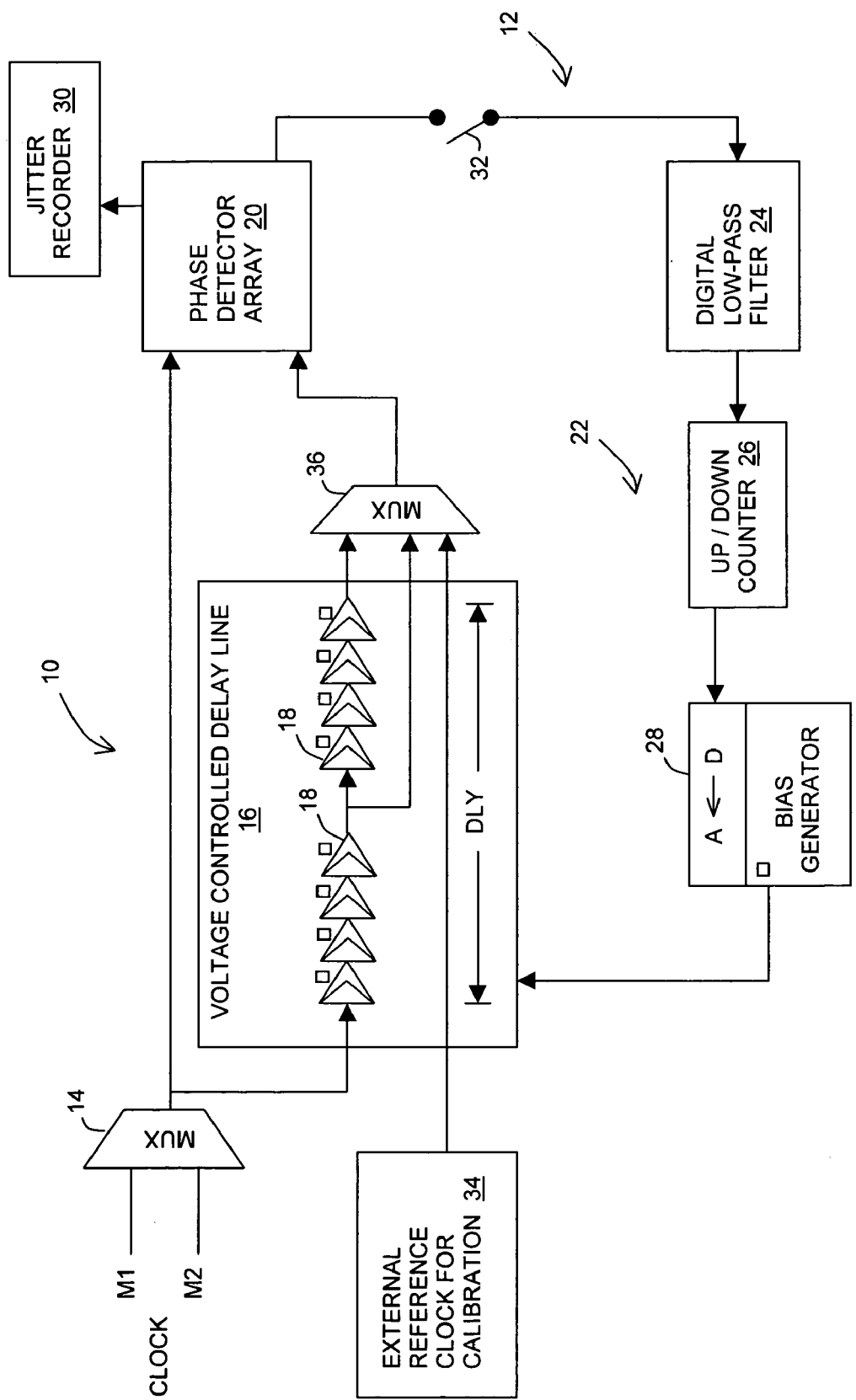
FIG. 1 is a block diagram of a conventional jitter measurement circuit.
Figure 2:
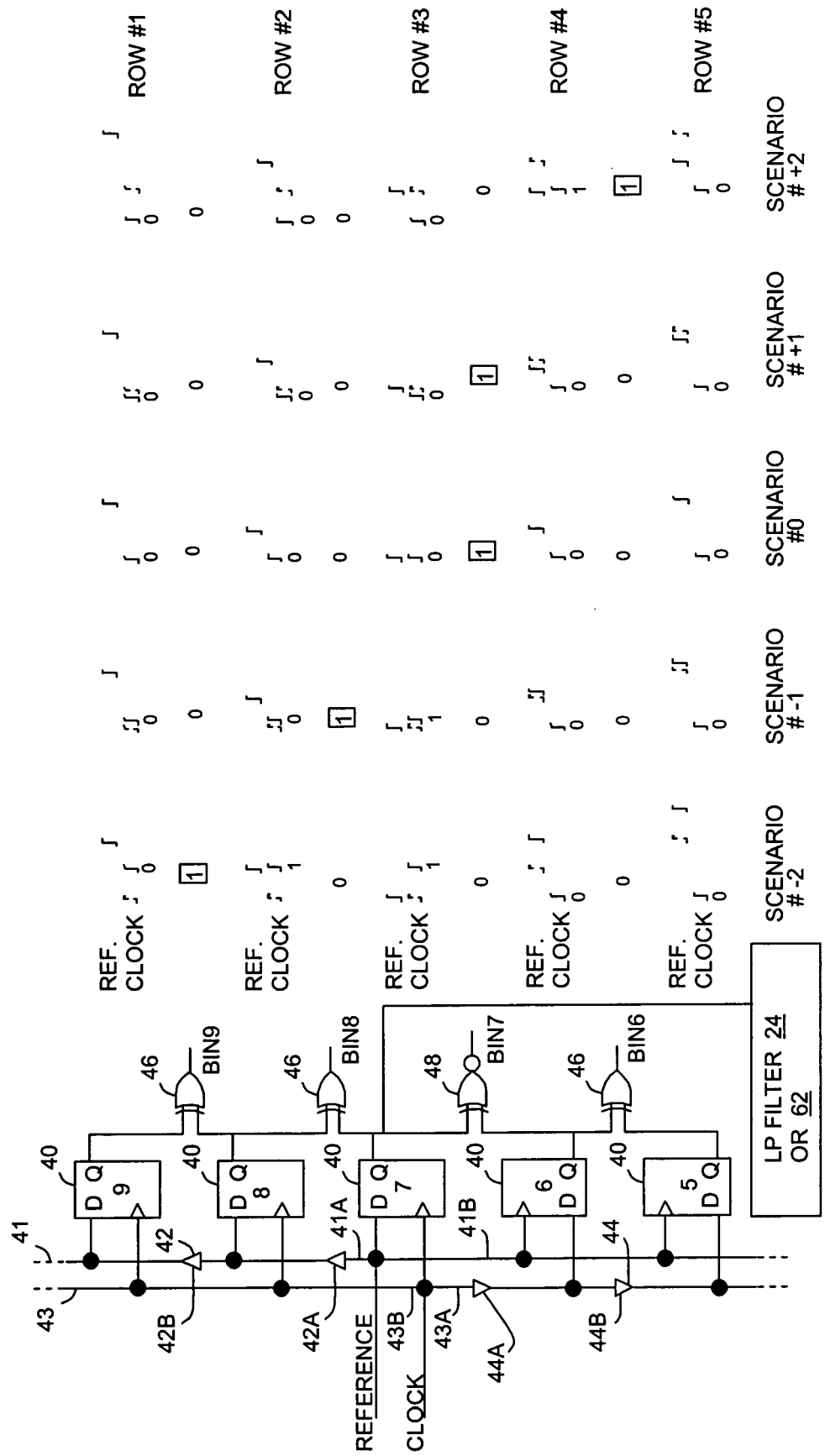
FIG. 2 is a schematic and timing chart of a phase detector array of the jitter measurement circuit of FIG. 1.
Figure 3:
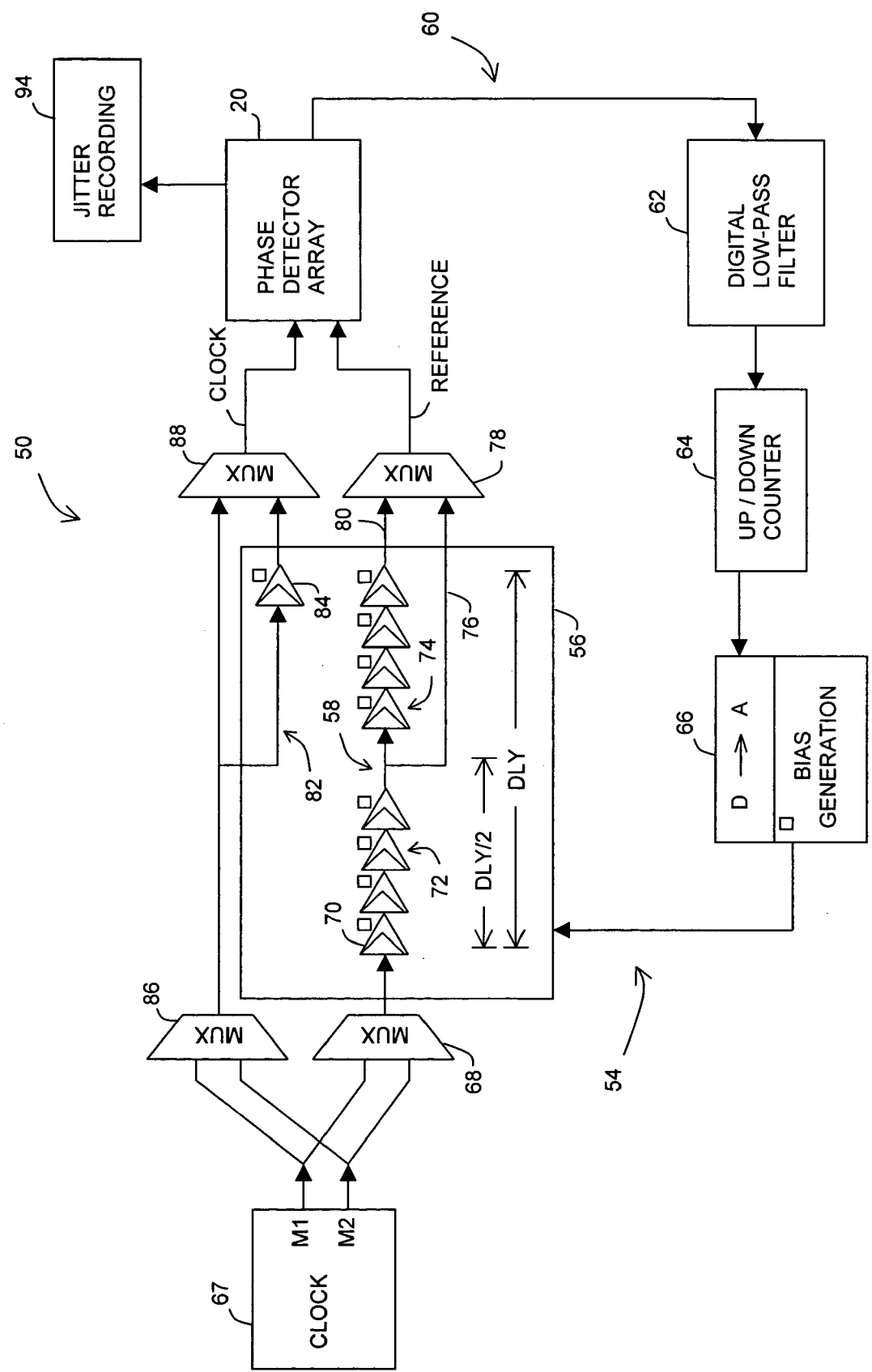
FIG. 3 is a block diagram of a jitter measurement circuit according to one embodiment of the present invention.

With reference to FIGS. 2 and 3, there is illustrated a jitter measurement circuit 50, in accordance with one embodiment of the present invention, for use in an integrated circuit (IC) chip (not shown). The circuit 50 may include the phase detector array 20 described in FIG. 2; hence, the array phase detector 20, and its components, retain the same reference numbers. In the circuit 50 a timing system is embedded in the chip to generate a reference signal with an adjustable edge from an externally provided clock signal. In a clock jitter mode of operation of the circuit 50, the generated reference signal is used for measuring phase jitter in the clock signal, as also undertaken in the prior art (FIGS. 1 and 2).

In a calibration mode of operation of the circuit 50, the generated reference signal is used in a two phase calibration method, according to one method of the present invention, for calibrating the array delays (i.e., array delay times) of the array delay elements 42 and 44 of the phase detector array 20 prior to the circuit 50 being used to measure phase jitter, thereby making it possible to eliminate the external calibration reference signal generator typically employed in the prior art. More specifically, the two-phase calibration method may be used to measure the array delays (i.e., array delay times) of the array delay elements 42 in the line 41 of the phase detector array 20, with such delay elements 42 being used to progressively delay the generated reference signal. Likewise, the two-phase calibration method may be used to measure the array delay times of the array delay elements 44 in the line 43 of the phase detector array 20, with such delay elements 44 being used to progressively delay the clock signal. These array delay times often have to be accurately determined prior to any phase jitter measurement by the circuit 50.

The circuit 50 has a delay-locked loop (DLL) 54. The DLL 54 includes delay line circuitry 56 having a voltage-controlled delay line (VCDL) 58 (i.e., adjustable delay line) for generating the reference signal with an adjustable delay DLY relative to the clock signal. More specifically, this adjustable delay DLY is defined to be the delay between the rising edge of the clock signal and the rising edge of the reference signal as these two signals exist at the output of the delay line circuitry 56 prior to entering the multiplexers 88 and 78, respectively after DLL lock. Generally, a set value of the adjustable delay DLY between the two signals may be substantially maintained until the clock signal and reference signals encounter the array delay elements 44 and 42, respectively. Hence, the adjustable delay line 58 may be characterized as a reference generator which receives the clock signal and generates the reference signal with the adjustable edge.

The DLL 54 further includes a feedback path 60 for adjusting the adjustable delay DLY of the adjustable delay line 58. During both the calibration and jitter measurement modes of operation of the circuit 50, the feedback path 60 may include a selected one of the phase detectors 40 of the phase detector array 20 (for example, phase detector labeled #7 in FIG. 2), a low-pass filter 62, an up/down counter 64, and a bias generator 66. The DLL 54 receives a clock signal M1 from a clock generator 67 with a clock period via a multiplexer 68.

As previously mentioned, the adjustable delay line 58 is used to delay the clock signal M1 so as to generate the reference signal. The adjustable delay line 58 includes a plurality of cascaded, adjustable delay elements 70, such as the illustrative eight adjustable delay elements 70. The eight adjustable delay elements 70 each have an individual adjustable delay or delay time, with each adjustable delay time being one-eighth of the accumulative adjustable delay DLY introduced by the adjustable delay line 58. Once the DLL 54 is "locked", the phase difference between the clock and the reference signals at the selected phase detector 40 has been substantially reduced to exactly one period of the clock signal M1 via the feedback path 60. In this "locked condition", the DLL 54 may provide a stable reference signal having an average clock period; hence, the reference signal is the clock signal delayed by an average duration.

All the adjustable delay elements 70 may be used with their accumulative delay times through the adjustable delay line 58, after the DLL 54 is locked, being the previously-defined adjustable delay DLY. When in the jitter measurement mode of operation, the circuit 50 may have an adjustable delay DLY equal to the clock period (or some multiple thereof) after DLL lock. In this jitter measurement mode, the feedback path 60 may be coupled to the phase detector #7 (no array delay element 42 or 44 delay the clock and reference signals).

When in the calibration mode of operation, the feedback path 60 may not only be coupled to the phase detector #7, but also may be coupled to the other phase detectors 40 one at a time. When one of these other phase detectors 40 are connected to the feedback path 60 (all other phase detectors are discounted), the adjustable delay DLY after DLL lock may be greater or less than the clock period, depending upon the array delay times of the array delay elements 44 or 46 which affect the reference or clock signals, respectively. With respect to the phase detectors 40 coupled to opposed sides of a given array delay element 44 or 46, the first phase detector may generate a first adjustable delay DLY at the DLL 54 before the delay of the delay element 44 or 46 and the second phase detector may generate a second adjustable delay DLY at the DLL 54 after the delay of the delay element 44 or 46. The difference between the first and second adjustable delays (i.e., delay values or times) at the DLL 54 may be characterized as a "delay difference" or "delay time difference" that is substantially equal to the array delay (i.e., array delay value or time) of the delay element 44 or 46. Hence, the array delay element 44 or 46 causes a delay difference that expands or contracts the adjustable delay DLY relative to the DLY value prior to incurring the array delay of the array delay element. In other words, the delay difference advances or delays the location of the leading edge of the reference signal (i.e., leading reference edge) relative to the leading edge of the clock signal (i.e., leading clock edge). Thus, a timing control on the reference edge is effectively embedded for calibration purposes. The measurement of the array delay times of the array delay elements 42 and 44 is described in detail hereinafter in the description of the two phase calibration method. During the two phase calibration method, the circuit 50 is in its calibration mode of operation.

The adjustable delay elements 70 may be shown grouped in two inverting half-delay circuits 72 and 74, with a center tap 76 going to a multiplexer 78 as a first input. However, in the calibration mode of operation of the circuit 50 all the adjustable delay elements 70 may be used, i.e., the center tap 76 is not used. Thereafter, in the jitter measurement mode of operation, the DLL 54 may be used to measure period jitter, high-phase jitter and/or low-phase jitter, With the latter two measurements making use of the center tap 76 and both of the clock signals M1 and M2. However, during calibration mode, the multiplexer 78 may be set to select a second input 80 having the accumulative delay of all eight adjustable delay elements 70.

The delay line circuitry 56, in addition to the first delay 58, also includes a second voltage controlled delay line (VCDL) 82 (i.e., adjustable delay line) which is only used in the calibration mode of operation. The adjustable delay line 82 may include a single adjustable delay element 84, which may be the same as the adjustable delays elements 70. The clock signal M1 and the inverted clock signal M2 may be provided to a multiplexer 86. During calibration, only the clock signal M1 may be used. The clock signal M1, through the multiplexer 86, is coupled to both the adjustable delay line 82 (with the adjustable delay element 84) and a multiplexer 88. The other end of the adjustable delay line 82 is connected to the multiplexer 88. It should be noted that the adjustable delay elements 70 and 84 may be characterized as being "compensated", i.e., adjusted by the DLL 54, whereas the array delay elements may be "uncompensated", i.e., not adjusted by the DLL 54. As will be discussed hereinafter, the inclusion of the adjustable delay element 84 may allow the delay line circuitry 56 to have two configurations.

Figure 4:
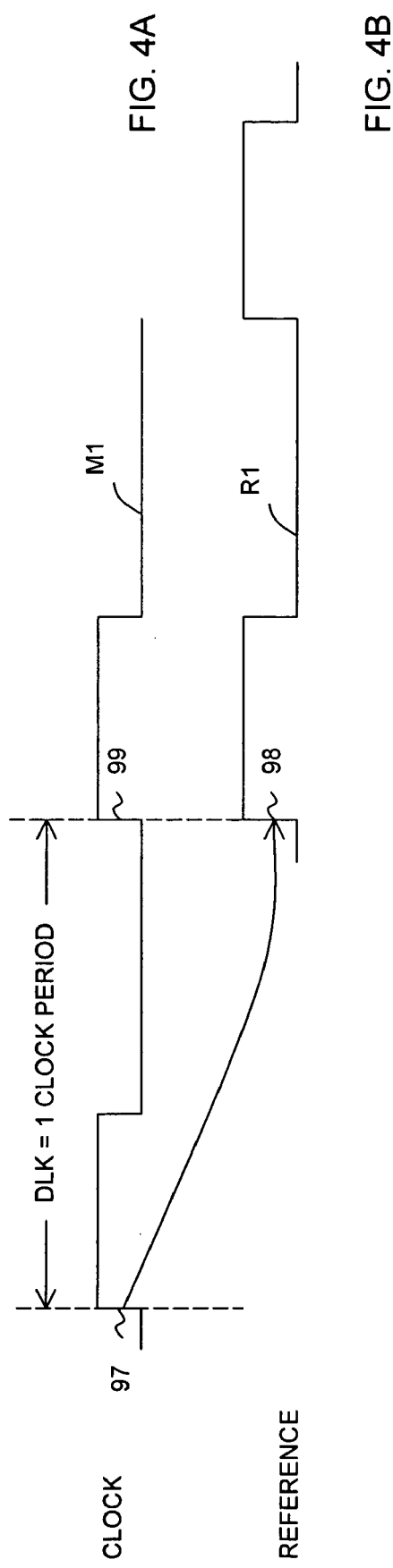
FIG. 4A is a timing diagram of a clock signal used in the jitter measurement circuit of FIG. 3.
FIG. 4B is a timing diagram of a reference signal generated from delaying the clock signal of FIG. 4A after lock of the delay-locked loop (DLL).

Referring to FIGS. 4A and 4B, it should be noted that the fixed and certain relationship between the rising edge 97 of the clock signal M1 to the rising edge 98 of the reference signal R1 is shown by an arrow connecting the two edges 97 and 98. Contrary to this, the following rising edge 99 of the clock signal M1, which is suppose to occur at a predetermined time after one clock period (e.g., 300 picoseconds period), may not occur exactly at this time due to "period jitter". Hence, there is an uncertainty from the rising edge to rising edge of the clock signal M1. Since the rising edge 98 of the reference signal R1 is fixed with respect to the rising edge 97 of the clock signal M1, it may be used as a reference by the phase detectors of FIG. 2 to measure the second rising edge 99 of the clock signal M1. If the clock signal M2 is used, then all the uses of the rising edges would become uses of the falling edges.

Referring back to FIGS. 2 and 3, the clock signal from the multiplexer 88 and the reference signal from multiplexer 78 may be fed to the phase detector array 20 to compare the phases of the rising edges of the clock and reference signals. In the calibration mode, each of the phase detectors 40 may be coupled to the feedback loop 60, but only one selected phase detector 40 may be coupled to the feedback loop 60 at a time. Although this may be any of the phase detectors 40, which are identified by numbers 0–15, phase detector #7 is illustrated in FIG. 2 as the selected phase detector. With phase detector #7, there is no delay introduced by the array delay elements 42 and 44; hence, the adjustable delay DLY is equal to the clock period.

In the phase detector array 20, the clock and reference signals couple to the lines 41 and 43. With respect to definitions, the line 43 is defined to have two portions: an array delay line 43A containing the serially coupled array delay elements 44 and a non-delay line 43B not containing any delay elements, with each line having an end coupled to the clock signal. The line 41 is defined to have two portions: an array delay line 41A containing the serially coupled array delay elements 42 and a non-delay line 41B not containing any delay elements, with each line having an end coupled to the reference signal. Each of the phase detectors 40 may be considered to have one input coupled to an array delay line 43A or 41A and another input coupled to a non-delayed line 43B and 41B. When measuring delay elements 42, the phase detector #7 may be considered as having one input coupled to the non-delayed line 43B and one input connected to array delay line 41A. When measuring delay elements 44, the phase detector #7 may be considered as having one input coupled to the non-delayed line 41B and one input connected to array delay line 43A.

The second phase of calibration may use two phase detectors 40, a first phase detector and a second phase detector, to measure the array delay of each array delay element 42 or 44. These may be the two phase detectors 40 immediately adjacent to and on opposite sides of each of the array delay elements. Hence, the first phase detector 40 may have a first input coupled to one side of a given delay element and the second phase detector 40 may have a first input coupled to the other side of the delay element. The first and second phase detectors 40 also may have a second input coupled to a non-delayed line 43B or 41B. Any given phase detector 40 may serve as a first phase detector 40 for one adjacent delay element in one direction and also as a second phase detector 40 for another adjacent delay element in the other direction. Hence, there are a plurality of first and second phase detectors, but only a pair of phase detectors may be relevant to measuring a given delay element.

In the jitter measurement mode of operation, only the phase detector #7 may be coupled to the feedback path 60, with the remaining phase detectors 40 of the phase detector array 20 only being used to detect the magnitude of the phase difference. The previously described "hits" of the phase bins (e.g., illustrated phase bins 6–9 in FIG. 2) quantify the phase difference, which may be displayed via a jitter recorder 94. In the calibration mode of operation, coupling the phase detector #7 to the feedback path 60 may be followed by coupling the remaining phase detectors 40 to the feedback loop. These phase detectors 40 may be sequentially coupled or coupled in any order. In an alternative embodiment, the phase detector #7 may be implemented without its outputs also being coupled to the logic gates 46 or 48; however, this may require inclusion of an additional phase detector. The remainder of the feedback path 60 will be described with the phase detector #7 being coupled to the feedback path 60 as a selected phase detector.

When the phase detector #7 is selected to be coupled to the feedback path 60 either during the first phase or the second phase of calibration, the output of the phase detector #7 may be coupled to the low pass filter 62. The selected phase detector #7 compares the clock and reference signals and may detect a phase difference between the two signals, but it only communicates the direction of shift between the two signals, i.e., a high or a low (1 or 0) depending on the relative phase relationship between the signals. The digital low-pass filter 62, which receives the binary output of the phase detector #7, may stabilize the output of the phase detector #7 over a time window and then issue a binary increment/decrement command to the up/down counter 64. For example, after receiving an uninterrupted predetermined number of consecutive 1's or 0's from the phase detector #7, the counter 64 may output a 1 or 0, respectively, to increment the up/down counter 64 to increase or decrease, respectively, its accumulative count by an integer of 1. The up/down counter 64 may be initialized at its center value. Hence, the filter 62 may filter out mistakes, poor decisions, decisions made by noise and like errors.

The accumulative values outputted by the counter 64, in response to the received outputs of the filter 62, may be called Digital to Analog Conversion (DAC) control words or DAC codes. These DAC control words may be provided to the bias generator 66 to cause the bias generator 66 to adjust or tune the delay to each one of the adjustable delay elements 70 and 84. More specifically, the bias generator 66 adjusts the bias voltages of the adjustable delay elements 70 and 84, which in turn adjusts the delays. The boxes adjacent to the adjustable delay elements 70 and 84, along with the corresponding box in the bias generator 66, indicate that the delays of these adjustable delay elements 70 and 84 may be adjustable by the bias generator 66. Hence, the DAC control word determines the voltage biases and the voltage biases determine the DLL delays. In one embodiment, as the value of the DAC control word increases, the bias voltage provided by the generator 66 to the delay elements decreases and the DLL delays increase. In other words, as the counter 64 goes up, the delays of the delay elements get longer and as the counter 64 goes down, the delays get shorter. The DLL 54 settles on just the right amount of voltage bias so that the relative delay through the adjustable delay line 58 is equal to a stable delay time, i.e., the DLL 54 is locked. There is a specific DAC control word creating this stable delay time, which may be recorded at a number of places during the two phase calibration method, according to one method of the present invention, as will be described hereinafter.

Figure 5:
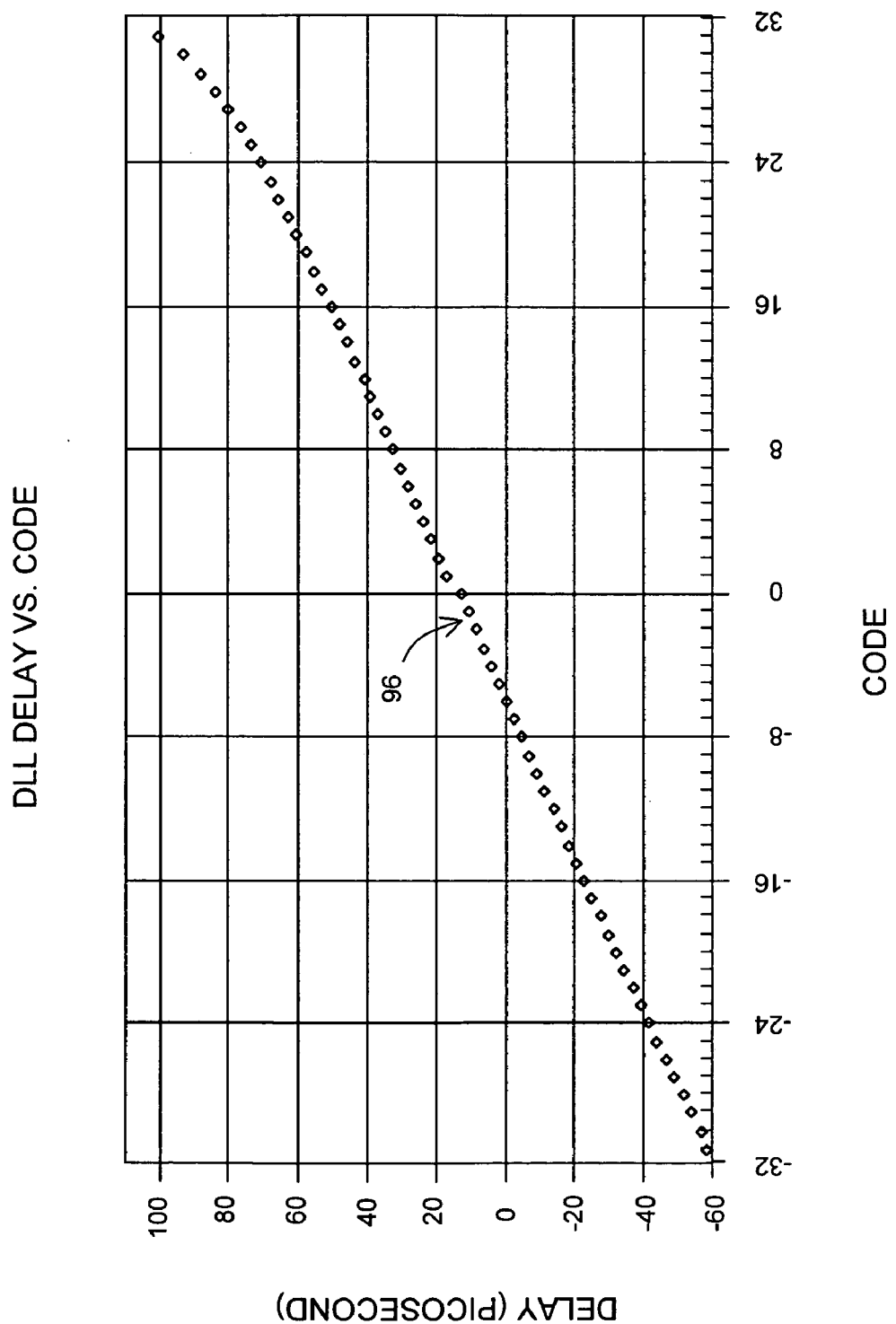
FIG. 5 is a chart of DLL delay versus counter control words which is created in a first phase of the calibration method, according to one method of the present invention.

In the first phase of the previously-mentioned two phase calibration method, a mathematical relationship between the DAC control words and the DLL delays is determined. Referring to FIG. 5, a chart shows the relationship between the DAC control words (abbreviated "code") and the DLL delay (i.e., delay times) of the adjustable delay elements 70 and 84 of the delay line circuitry 56. The vertical axis of the chart represents a range of DLL delays for each individual adjustable delay element 70 or 84, although the vertical axis may be multiplied by 8 to represent a range of the total DLL delay through the adjustable delay line 58. This is because each of the adjustable delay elements 70 and 84 is set to have the same DLL delay value by the bias generator 66. In one embodiment, the DLL delay times may be in picoseconds and the up/down counter 64 may have a count or DAC control words having a range extending from −32 to 0 and then from 0 to +32. This defines 65 DAC control words, each of them being a distinct integer number. The relation may be approximated by a straight line 96; hence, the determined relationship is substantially a linear relationship. In general, to determine this linear relationship, the DLL may be locked with at least one pair of different versions of the clock signals, such as M1 and M3 shown in FIGS. 6A and 6C respectively, separated by a delay (e.g., delay of delay element 84), to define two points on the substantially straight line 96 and therefore to define the relationship between DLL delay times for the adjustable delay lines 58 and 83 and the DAC control words. Hence, these two points define a line segment. Through extrapolation, the line segment may be extended to define the rest of the line 96. In other words, these two points provide the slope of the line 96. Hereinafter, the first phase of the calibration for deriving this substantially linear relationship is described with respect to the schematic of FIG. 3, timing diagrams of FIGS. 6A–6D, and a flow chart of a first phase process of FIG. 7. To obtain the two points of this linear function or relationship, the delay line circuitry 56 must assume a first and a second configuration.

Figure 6:
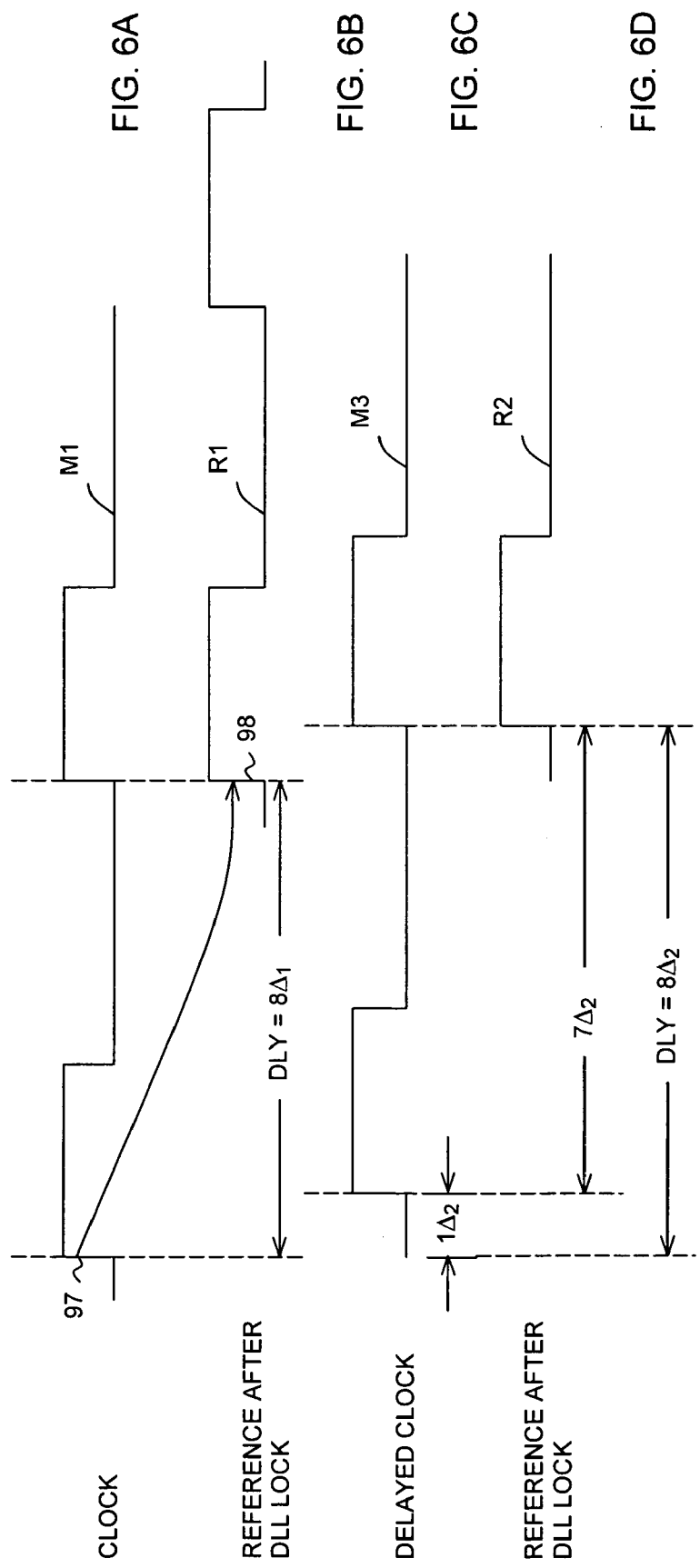
FIG. 6A is a timing diagram of a non-delayed clock signal used during the first phase of the calibration method, according to one method of the present invention.
FIG. 6B is a timing diagram of the reference signal after DLL lock, which is generated from the clock signal of FIG. 6A using an effective 8 $\Delta_1$ delay during the first phase of the calibration method, according to one method of the present invention.
FIG. 6C is a timing diagram of the clock signal delayed by 1 $\Delta_2$ delay which is used during the first phase of the calibration method.
FIG. 6D is a timing diagram of the reference signal after DLL lock, which is generated from the clock signal of FIG. 6A using an effective 7 $\Delta_2$ delay during the first phase of the calibration method, according to one method of the present invention.

In the first configuration of the delay line circuitry 56, the circuitry 56 may be configured so that the delay line 82 with its adjustable delay element 84 is not included (zero delay for the clock signal) and the adjustable delay line 58 has the eight adjustable delay elements 70. The phase detector array 20 eventually will receive two inputs, the clock signal and reference signal, after the DLL 54 has been locked, that are aligned with a stable average adjustable delay DLY between the two signals. This locking may be achieved by the feedback path 60. The timing diagrams for the configuration are shown in FIGS. 6A and 6B. Referring to FIG. 6A, the clock signal M1, as provided to the phase detector array 20 without the delay of the adjustable delay element 84, is shown. The clock signal M1 may have a rising edge 97 and a clock period. For example, the clock period may be 300 picoseconds. In FIG. 6B, the reference signal R1 is shown after the DLL has locked to a stable average delay of the adjustable delay DLY. More specifically, the delay between the rising edge 97 of the clock signal M1 and a rising edge 98 of the reference signal R1 is the adjustable delay DLY. This adjustable delay DLY may be subdivided into 8 $\Delta_1$ delays, where each of the 8 $\Delta_1$ delays corresponds to one of the eight adjustable delay elements 70; hence, each of the $\Delta_1$ delay is $1/8^{th}$ of the adjustable delay DLY. In the case of the adjustable delay DLY being 300 picoseconds, each $\Delta_1$ delay is 37.5 picoseconds. This first configuration may be characterized as having an effective 8 $\Delta_1$ delay. This first effective 8 $\Delta_1$ delay is generated in response to a first control word (identified as DAC code A). This DLL delay and the DAC code A define a first point on the linear function of FIG. 5.

In the second configuration of the delay line circuitry 56, the circuitry 56 may also be configured so that the delay line 82, with its adjustable delay element 84, delays the clock signal M1. Again, the adjustable delay line 58 has eight adjustable delay elements 70. The timing diagrams for this configuration are shown in FIGS. 6C and 6D. In FIG. 6C the clock signal M3, as provided to the phase detector array 20 after the introduction of a single $\Delta_2$ delay of the adjustable delay element 84, is shown. Initially, the clock signal M3 and the reference signal will be mismatched at the phase detector array 20. After a few iterations of corrections, the DLL 54 again will be locked (clock and reference edges aligned) to a stable bias providing an average adjustable delay DLY. At this point, the DLL has cancelled out or overcome the mismatch. In FIG. 6D the reference signal R2 is shown after the DLL 54 has locked to the stable average adjustable delay DLY; however, now the adjustable delay DLY is caused by an effective 7 element delay, as shown by the 7 $\Delta_2$ delays. The effective 7 element delay is generated by the eightfold worth of adjustable delay elements 70 measured against onefold worth of delay element 84; hence, each $\Delta_2$ delay is $1/7^{th}$ of the adjustable delay DLY. In the case of adjustable delay DLY being 300 picoseconds, each $\Delta_2$ delay would be 42.9 picoseconds. Another visualization of this arrangement is that the adjustable delay element 84 cancels out one of the 8 adjustable delay elements 70, thereby effectively leaving 7 adjustable delay elements 70 to generate the adjustable delay DLY between the clock signal M3 and the reference signal R2. Hence, the $\Delta_2$ delay must be greater in magnitude than the $\Delta_1$ delay, e.g., 42.9 picoseconds versus 37.5 picoseconds. This second configuration may be characterized as having a "7 $\Delta_2$ effective delay". This second configuration defines a second DLL delay, which is generated in response to a second control word (identified as DAC code B), with the combination of the two defining a second point on the linear function of FIG. 5.

In summary, the first configuration of the delay line circuitry 56 includes the clock signal with 0 $\Delta_1$ delay combined with reference signal with an 8 $\Delta_1$ delay, which defines an effective 8 $\Delta_1$ delay for the delay line circuitry 56. This effective 8 $\Delta_1$ delay generates the DAC code A that may be associated with a DLL element delay of 37.5 picoseconds. The second configuration of the delay line circuitry includes the clock signal with 1 $\Delta_2$ delay combined with reference signal with an 8 $\Delta_2$ delay, which defines an effective 7 $\Delta_2$ delay for the delay line circuitry 56. This effective 7 $\Delta_2$ delay generates the DAC code B, which may be associated with a DLL element delay of 42.9 picoseconds.

Although the two ascertained points on the graph of FIG. 5 may define the desired substantially linear relationship, i.e., provides the slope of the line, in another embodiment, there may be additional configurations of clock signal with an $i\Delta_{i+1}$ delay combined with the reference signal to give the delay line circuitry 56 an effective $(8-i)\Delta_{i+1}$ delay, where i has an integer range from 0 through 8. For example, each additional delay line, coupled to the multiplexer 88, may have one additional adjustable delay element 84 (e.g., 2, 3, 4 delay elements 84). More points of the graph may require less extrapolation and may lead to more accuracy; however, there may be a design tradeoff of additional power consumption with additional points.

Figure 7:
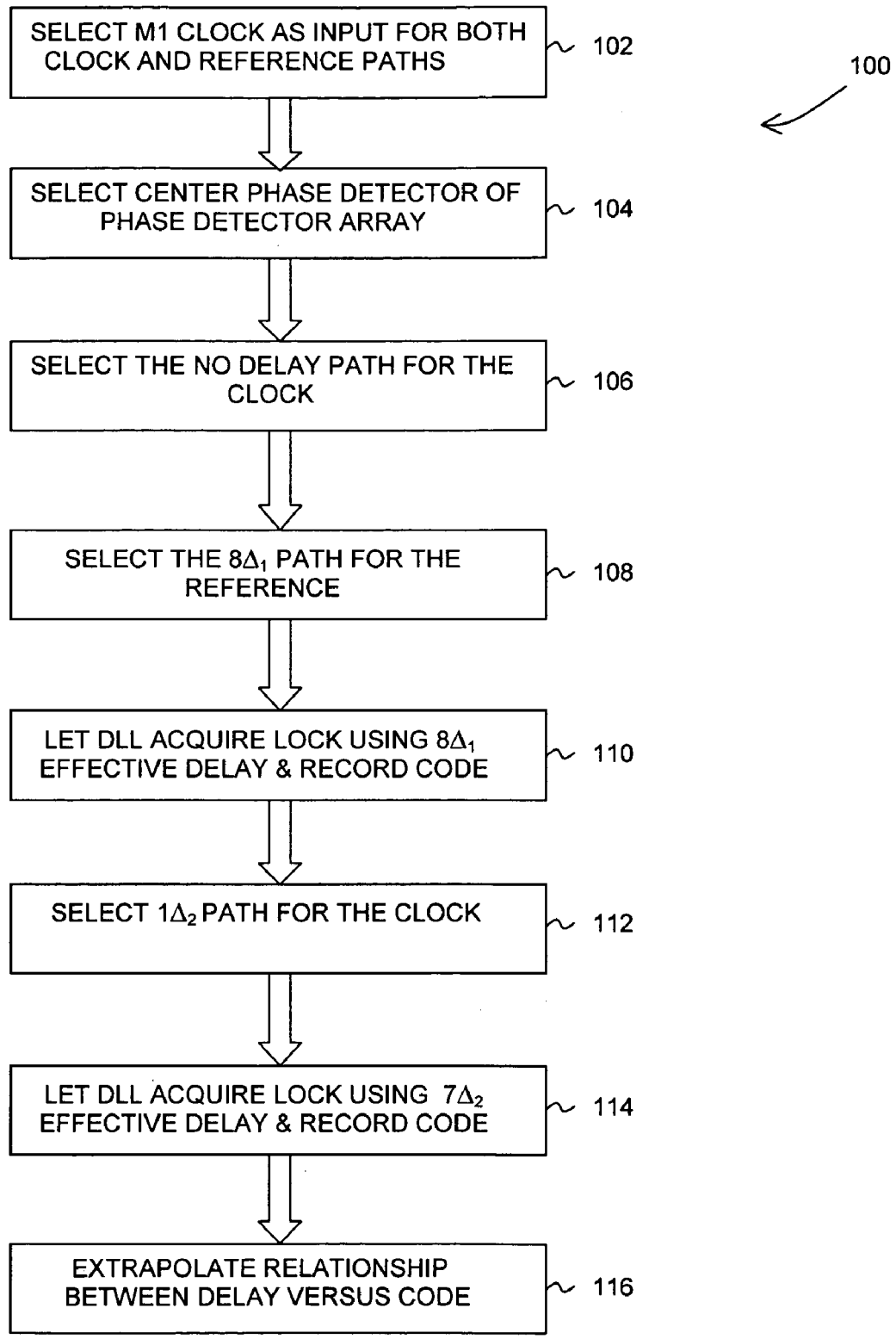
FIG. 7 is a flow chart of the first phase of the calibration method, according to one method of the present invention.

Referring to FIG. 7, a flow chart of the first phase 100 of the two-phase calibration method, according to one method of the present invention, is shown for generating the substantially linear relationship of FIG. 5. At block 102, the clock signal M1 may be selected as input to both clock signal and reference signal paths. At block 104, the center phase detector (phase detector #7 in FIG. 2), which is not affected by the delays of the array delay elements, may be selected for its output to be coupled to the feedback path; hence, its output is used for DLL locking. In determining the first point for defining the substantially linear function shown in FIG. 5, at block 106, the clock M1 may be coupled to the phase detector array through a path with no delay element. At a block 108, a path with an effective 8 $\Delta_1$ delay may be selected for passing the clock signal M1 so as to generate the reference signal. At a block 110, the DLL may be allowed to acquire a lock using the effective 8 $\Delta_1$ delay. Upon obtaining lock, a first DAC control word or code may be recorded. The first DAC control word and the associated first DLL delay may be used to define a first point of the graph of FIG. 5. In determining the second point for defining the graph of FIG. 5, at a block 112 the clock M1 is coupled to the phase detector array through a path having a delay element with a $\Delta_2$ delay. At a block 108, a path with an effective 7 $\Delta_2$ delay may be selected for passing the clock signal M1 so as to generate the reference signal and the DLL is allowed to acquire a lock using the effective 7 $\Delta_2$ delay.

Upon obtaining lock, a second DAC control word or code is recorded. The DAC control word and the associated second DLL delay may be used to define a second point of the graph of FIG. 5. At a block 116, the substantially linear function or relationship may be extrapolates over the range of DLL delays vs. DAC control words or codes shown in FIG. 5.

With reference to FIGS. 2 and 3, the second phase of the two phase calibration method, according to one method of the present invention, may measure the values of the delays through each of the array delay elements 42 and 44. In the illustrative phase detector array 20, there may be 15 delay elements. However, only those phase detectors used to measure array delay elements 42A, 42B, 44A, and 44B, which are illustrated in FIG. 2, will be discussed hereinafter. This second phase involves connecting the phase detectors 40, one at a time, to the feedback path 60, letting the DLL 54 acquire its lock, and then recoding the DAC control word generated by the up/down counter 64. Using the previously-established relationship between DAC control words and DLL delays ascertained during the first phase, the delay of the array delay elements 42 and 44 may be obtained. The second phase is described hereinafter with respect to timing diagrams shown in FIGS. 8A through 8K and a flow chart of FIG. 9. The relative positions of the rising edges of the clock signal versus the reference signal prior to DLL lock, as shown in FIGS. 8B, 8D, 8F, 8H, and 8J, correspond with the edge positions illustrated in Scenario #0 of FIG. 2 (Scenario #0 had no phase jitter component). For each of the phase detectors, timing diagrams of the reference signal are shown after the array delay elements, both before and after DLL lock. Although the reference clock is not shown at the delay line circuitry 56, the modification the adjustable delay DLY is shown. Hence, the modified adjustable delay DLY specifies the beginning of the rising edge of the reference signal as it is positioned relative to the clock signal at the delay line circuitry.

Referring to FIGS. 2 and 3, the second phase may begin by coupling the output of the center phase detector, phase detector #7, to the feedback path 60. In FIG. 8A, the previously described clock signal M1 is shown as provided to the phase detector #7 of FIG. 2, which is not delayed through an array delay element 44. In FIG. 8B, the reference signal, before DLL lock, is shown as provided to the phase detector #7, which is not delayed through one of the array delay elements 42. Since the reference signal is shown before DLL lock in FIG. 8B, the reference signal is illustrated starting at a middle point, such middle point being determined the initialization of the up/down counter 64. In FIG. 8C, the reference signal, which has become the previously described reference signal R1, is shown after the DLL lock, so that the reference signal now has stabilizes on its locked position with a adjustable delay DLY relative to the clock signal M1. With phase detector #7, the adjustable delay DLY is equal to the clock period of the clock signal M1. To obtain this stabilization, the previously-described Code A is generated by the up/down counter 64.

Referring to FIGS. 2 and 3, next the output of the phase detector #8 may be coupled to the feedback path 60. In FIG. 8D, the reference signal, which is an input to the phase detector #8 of FIG. 2, is shown after passing through the array delay element 42A of FIG. 2, but before DLL lock. At this point, the array delay element 42A has caused the reference signal to be offset from the clock signal by the clock period and an added $\Delta_3$ delay of the array delay element 42A ($\Delta_3$ delay shown in FIG. 8E). Hence, there is a mismatch between the reference and clock edges at the input of the phase detector #8 in an amount of the $\Delta_3$ delay. In FIG. 8E, the reference signal is shown again after the array delay element 42A, but now after stabilization in its locked position relative to the clock signal. Now the $\Delta_3$ delay mismatch has been eliminated and the clock and reference edges are again aligned at the input of the phase detector #8. But since the clock and references edges are aligned at the input of the phase detector #8, they are not aligned at the output of the delay line circuitry 56. At the delay line circuitry 56, the clock and reference signals are now separated by the adjustable delay DLY=8 $\Delta_1-\Delta_3$. In other words, to achieve alignment of the clock and reference edges at the phase detector #8, at the output of the delay line circuitry 56 the clock and reference edges are misaligned by $\Delta_3$ delay. Hence, this misalignment at the delay line circuitry 56 is equal to the array delay time or value of the array delay element 42A. To achieve this DLL stabilization with the phase detector #8 coupled to the feedback path 60, the up/down counter 64 iterates to a new control word, Code C, which is recorded. Using the Code A (no array delay element) and the Code C (with delay of array delay element 42A), two DLL delay values (i.e., the first DLL value and the second DLL value) may be obtained from the chart of FIG. 5. The value of $\Delta_3$ delay of the array delay element 42A is the difference in these two DLL values (needs to be multiplied by 8 in the case where FIG. 5 delay values are for the individual adjustable delay elements 70 instead of the total DLL delay for the adjustable delay line 58).

Referring to FIG. 8F, after the array delay element 42B and before DLL lock, the array delay elements 42A and 42B have caused the clock signal and the reference signal to be offset by the clock period plus both the $\Delta_3$ delay of the array delay element 42A and a $\Delta_4$ delay of the array delay element 42B. Hence, these clock and reference signals are inputs to the phase detector #9. FIG. 8G shows the reference signal after the array delay element 42B and DLL lock. The mismatch of $\Delta_3+\Delta_4$ delay at the input of the phase detector #9 has been eliminated. But at the delay line circuitry 56, the clock and reference signals are separated by the adjustable delay DLY=8 $\Delta_1-\Delta_3-\Delta_4$. To achieve this DLL stabilization, the up/down counter of FIG. 3 iterates to a new control word, Code D, which is recorded. Using the Code C (with delay of array delay element 42A) and the Code D (with delays of array delay elements 42A and 42B), two DLL delay values may be obtained from the chart of FIG. 5. The value of $\Delta_4$ delay of the array delay element 42B is the difference in these two DLL values (multiplied by 8).

Referring to FIG. 8H, after the array delay element 44A, the delay element 44A has caused the clock signal and reference signal to be offset by the clock period less the $\Delta_5$ delay of the array delay element 44A. These clock and reference signals are inputs to the phase detector #6. FIG. 8I shows the reference signal after DLL lock. At the delay line circuitry 56, the reference signal is offset with the clock signal so that the adjustable delay DLY=8 $\Delta_1+\Delta_5$. To achieve DLL stabilization, the up/down counter of FIG. 3 iterates to a new control word, Code E, which is recorded. Using the Code A (with no array delay element) and the Code E (with delay of array delay element 44A), two DLL delay values may be obtained from the chart of FIG. 5. The value of $\Delta_5$ delay of the array delay element 44A is the difference in these two DLL values (multiplied by 8).

Referring to FIG. 8J, after the array delay element 44B, the array delay elements 44A and 44B have caused the clock and the reference signal to be offset by the clock period less both the $\Delta_5$ delay of the array delay element 44A and a $\Delta_6$ delay of the array delay element 44B. These clock and reference signals are inputs to the phase detector #5. FIG. 8K shows the reference signal after DLL lock. At the delay line circuitry 56, the reference signal is offset with respect to the clock signal so that the adjustable delay DLY=8 $\Delta_1+\Delta_5+\Delta_6$. To achieve DLL stabilization, the up/down counter of FIG. 3 iterates to a new control word, Code F, which is recorded. Using the Code E (with array delay element 44A) and the Code F (with array delay elements 44A and 44B), two DLL delay values may be obtained from the chart of FIG. 5. The value of $\Delta_6$ delay of the array delay element 44B is the difference in these two DLL values (multiplied by 8).

Referring to FIGS. 2 and 3 and FIGS. 8A–8K, in summary the clock and reference signals may be initially aligned at the phase detector #7 after DLL lock. This correlates with a given adjustable delay DLY (one clock period) of the DLL 54 that may be used as a frame of reference for characterizing and describing the other phase detectors. As each selected phase detector 40 is coupled to the feedback path 60 and DLL lock is obtained, the delay element(s) 42 or 44 interposed between the phase detector #7 and the selected phase detector 40 generate(s) a delay difference (e.g., $\Delta_3$, $\Delta_4$, $\Delta_5$, or $\Delta_6$ delay or combinations thereof) to the adjustable delay DLY of 1 clock period achieved by the phase detector #7. Hence, the previous value of the adjustable delay DLY at the delay line circuitry 56 may be adjusted by this delay difference to obtain a new value of the adjustable delay DLY. This delay difference may allow for leading edges of the clock and reference signals to be aligned in front of the selected phase detector 40, even though they will be offset upon leaving the delay line circuitry 56. This delay difference to the adjustable delay DLY is equal in magnitude to the array delay (i.e. array delay time) of delay element or combination of delay elements. More specifically, in the case of the array elements 42, there is a delay difference of the adjustable delay DLY equal in magnitude to the array delay of the delay element 42 that results in the reference edge being "advanced" in time by the DLL 54 so that the clock and references edges are aligned in front of the selected phase detector. Also, the array delays of the delay elements 44 may result in a delay difference of the adjustable delay DLY by the DLL 54 equal in magnitude to the array delay of the delay elements 44 that results in the results in the reference edge being "delayed" in time by the DLL 54 so that the clock and reference edges are aligned in front of the selected phase detector. Measurement of each of these delay differences to the adjustable delay DLY may be accomplished by determining the control words after the two DLL locks, recording the control words and then mapping them to two DLL delays by use of the substantially linear relationship of FIG. 5. The difference in the two DLL delay values may provide the delay time for the delay elements 42 and 44.

Figure 9:
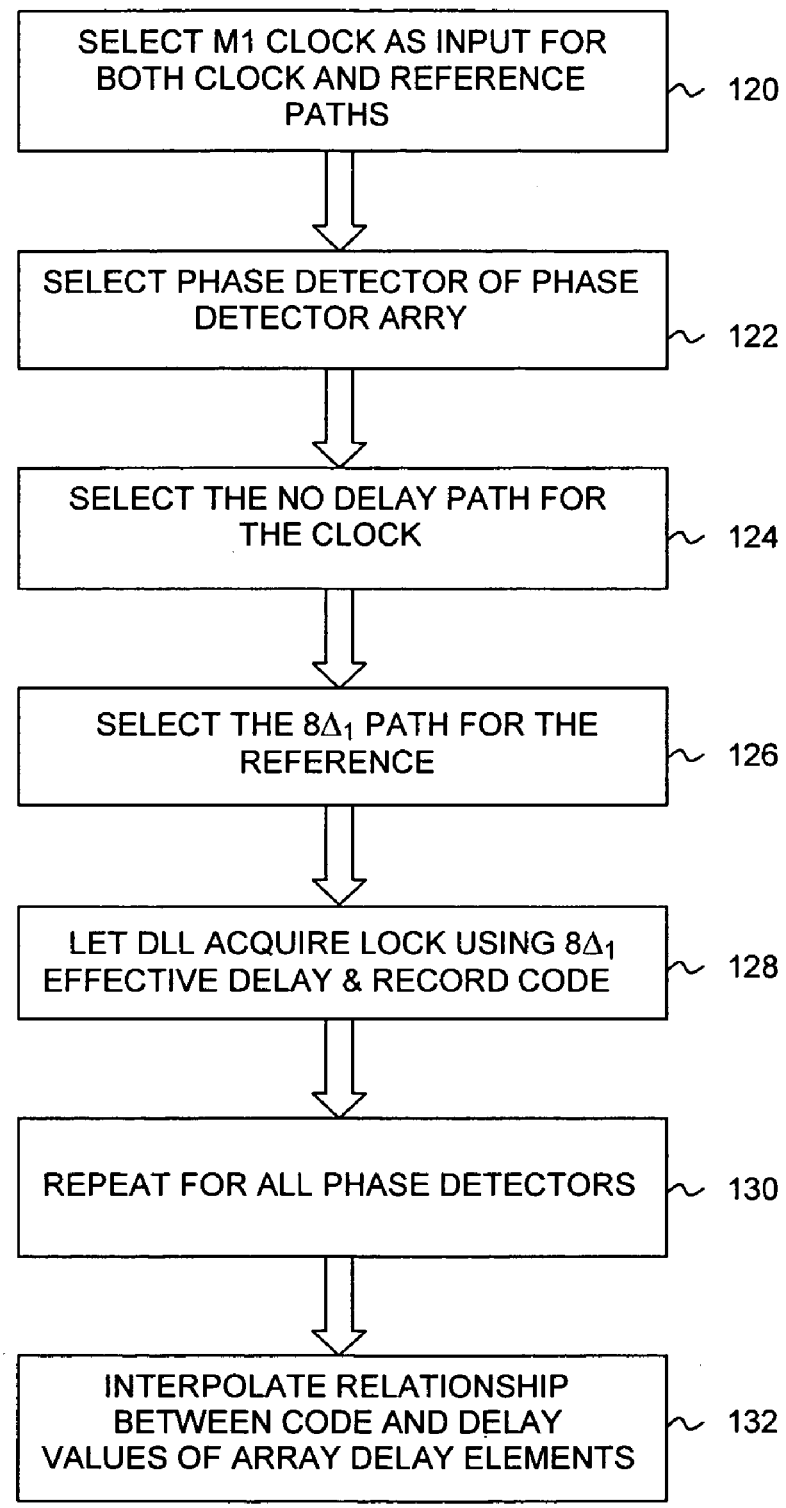
FIG. 9 is a flow chart of the second phase of the calibration method, according to one method of the present invention.

Referring to FIG. 9, a flow chart of the second phase for ascertaining the delays of the array delay elements of FIG. 2 is shown. At a block 120, the M1 clock may be selected to be the input to both the clock signal and reference signal paths. At a block 122, a phase detector of FIG. 2 is selected which corresponds to the array delay element to be measured. The output of the phase detector is coupled to the feedback path. At a block 124, the no delay path in the delay line circuitry may be selected. At a block 126, a path with an effective 8 $\Delta_1$ delay may be selected for passing the clock signal M1 so as to generate the reference signal. At a block 128, the DLL may be allowed to acquire a lock using the effective 8 $\Delta_1$ delay. Upon obtaining lock, a DAC control word or code is recorded. At a block 130, the above procedure may be repeated for the remaining phase detectors. At a block 132, the relationship between DAC codes and DLL delays may be interpolated to obtain the delay values of the array delay elements.

Figure 10:
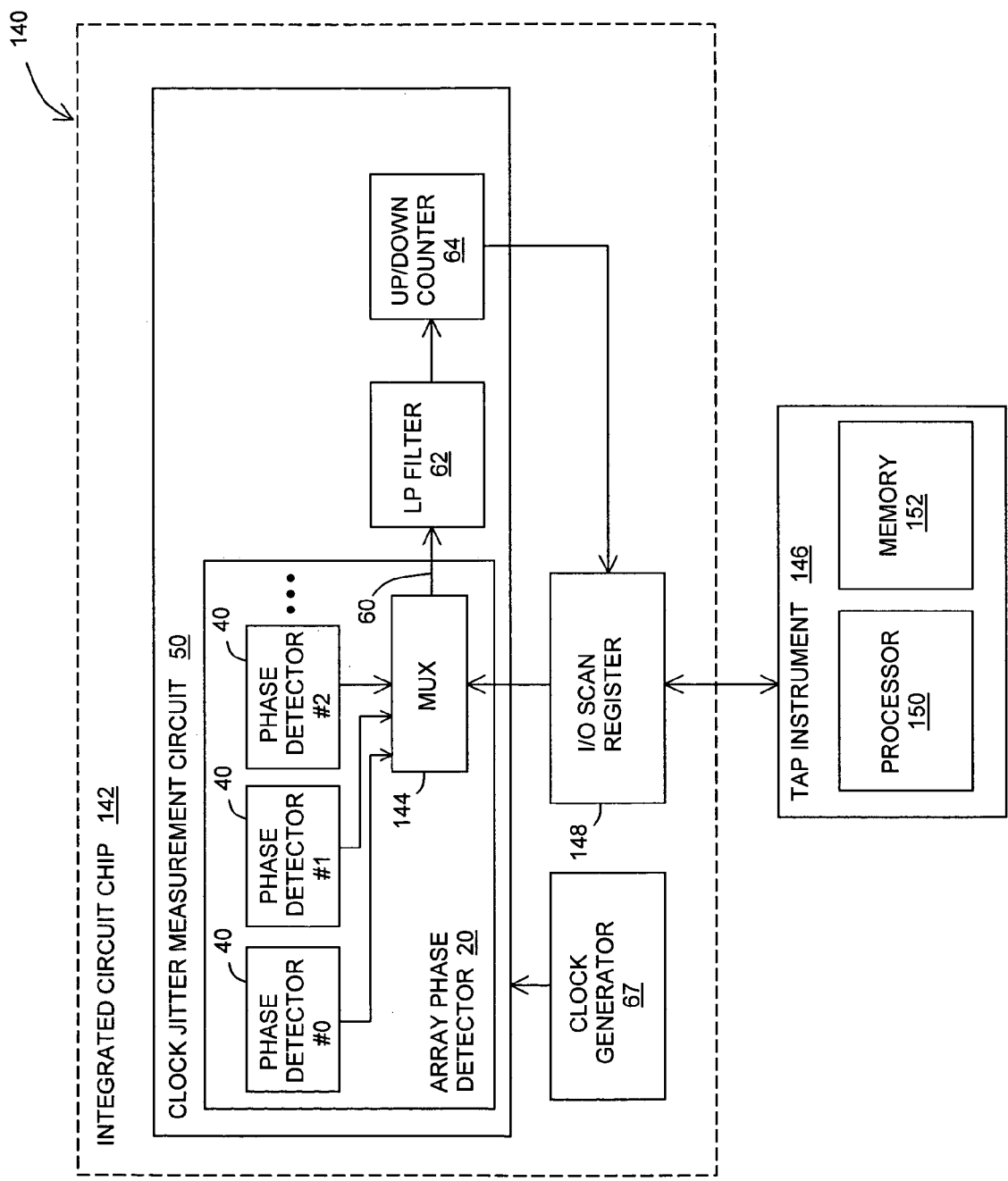
FIG. 10 is a block diagram of a system including the jitter measurement circuit of FIG. 1 according to one embodiment of the present invention

Referring to FIG. 10, a calibration and jitter measurement system 140 is shown. The system 140 includes the jitter measurement circuit 50 with the phase detector array 20. The circuit 50 is part of a processor IC chip 142. The clock generator 67 may provide the clock M1 to the circuit 50. The clock generator 67 may include a phase lock loop circuit on the IC chip 142. A multiplexer 144 is included in the phase detector array 20 and may select, one at a time, the 15 phase detectors 40 of FIG. 2 (only phase detectors #0, 1, and 2 are illustrated in FIG. 10) and connect their outputs to the feedback path 60. In FIG. 10, only part of the feedback path 60 is shown, i.e., the low pass filter 62 and up/down counter 64. Hence, the multiplexer 142 may allow the test engineer to select which phase detector 40 provides the feedback signal via the feedback path 60.

The test engineer connects the IC chip 142 to a Test-Access-Port (TAP) instrument 146. The TAP instrument 146 is a debugging tool also used for purposes other than the two phase calibration method according to one method of the present invention. The TAP instrument 146 may allow the test engineer to control a scan register 148 within the chip 142. The scan register 148 may function as an input/output interface to the chip 142 during calibration. More specifically, it may receive the command from the TAP instrument 146 to set the multiplexer 144 to output one of the feedback signals from one of the phase detectors 40 to the feedback path 60. It may also receive the control words from the up/down counter 64 to be provided to the TAP instrument 146.

The TAP instrument 146 may include a processor 150 and a memory 152. The TAP instrument 146 may store the substantially linear relationship of FIG. 5 in the memory 152. The TAP instrument 146 may record in the memory 152 the values of the DAC control words after each DLL lock for each of the phase detectors 40. The processor 150 may process the DAC control words, using the substantially linear relationship of FIG. 5, to obtain the DLL delays corresponding to the DAC control words. The processor 150 then may calculate the difference between the DLL delay values to obtain the array delay times for the array delay elements of FIG. 2.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. Therefore, it is manifestly intended that this invention be limited only by the claims and the equivalents thereof.

What is claimed is:

1. A method, comprising:
   generating a clock signal with a clock edge;
   generating a reference signal with a reference edge using an adjustable delay line to delay the clock signal;
   delaying a selected one of the clock signal and the reference signal through an array delay line having an array delay element with an array delay;
   adjusting the adjustable delay line to obtain a first adjustable delay so that the clock and reference edges are aligned on one side of the array delay element;
   adjusting the adjustable delay line to obtain a second adjustable delay so that the clock and reference edges are aligned on the other side of the array delay element; and ascertaining a delay difference between the first and the second adjustable delays to determine a value of the array delay provided by the array delay element.

2. The method according to claim 1, wherein the adjusting of the adjustable delay line to obtain the first adjustable delay includes detecting a first phase difference between the clock and the reference edges and adjusting the adjustable delay line until the first phase difference becomes substantially zero; and the adjusting of the adjustable delay line to obtain the second adjustable delay includes detecting a second phase difference between the clock and the reference edges and adjusting the adjustable delay line until the second phase difference becomes substantially zero.

3. The method according to claim 2, wherein the generating of the reference signal using the adjustable delay line includes generating a feedback signal to adjust the adjustable delay line using a delay-locked loop having the adjustable delay line and a feedback path having a single phase detector at a time; the detecting of the first phase difference includes using a first phase detector of a phase detector array when coupled into the feedback path; and the detecting of the second phase difference includes using a second phase detector of the phase detector array when coupled into the feedback path.

4. The method according to claim 3, wherein the feedback signal includes a control word selected from a range of control words and the adjustable delays are selected from a range of adjustable delays; wherein the ascertaining of the delay difference includes defining a substantially linear relationship between the range of control words and the range of adjustable delays; generating and recording a first control word in responsive to the first phase difference which locks the delay-locked loop; generating and recording a second control word in response to the second phase difference which locks the delay-locked loop; and using the substantially linear relationship to convert the first and the second control words to the first and the second adjustable delays.

5. The method according to claim 1, wherein the delaying of the selected one of the clock signal and the reference signal through the array delay element includes progressively delaying the clock signal through a first plurality of array delay elements of a phase detector array to measure phase jitter and progressively delaying the reference signal through a second plurality of array delay elements of the phase detector array; the adjusting of the adjustable delay line to obtain a first adjustable delay includes detecting a first phase difference between the clock edge and the reference edge before each of the array delay elements and adjusting the adjustable delay line until the first phase difference becomes substantially zero; and the adjusting of the adjustable delay line to obtain a second adjustable delay includes detecting a second phase difference between the clock edge and the reference edge after each of the array delay elements and adjusting the adjustable delay line until the second phase difference becomes substantially zero.

6. The method according to claim 1, wherein the clock and reference edges are a selected one of rising edges or falling edges.

7. A method, comprising:
generating a clock signal with a clock edge and delaying the clock signal with a delay-locked loop (DLL) having an adjustable delay to generate a reference signal with a reference edge;
progressively delaying a selected one of the clock signal and the reference signal through an array delay line with a plurality of array delay elements;
for one or more of the array delay elements, comparing the clock and reference edges with a first and a second phase detector coupled to the array delay line on opposed sides of each of the array delay elements to generate a first and a second feedback signal to twice adjust the adjustable delay so that the clock and reference edges are twice aligned; and
using the first and second feedback signals to determine an array delay time for each of the one or more array delay elements.

8. The method according to claim 7, further comprising employing a phase detector array having the phase detectors and the array delay line.

9. The method according to claim 7, wherein the delay-locked loop further includes an adjustable delay line having the adjustable delay and a feedback path for coupling the first and second feedback signals to the adjustable delay line; and the comparing of the clock and reference edges with the first and second phase detectors includes effectively coupling only one of the phase detectors into the feedback path at a time.

10. The method according to claim 9, wherein the adjustable delay line has a plurality of adjustable delay elements providing the adjustable delay with each adjustable delay element being settable to a DLL delay time selected from a range of DLL delay times; and the using of the first and second feedback signals to determine the array delay time of each of the array delay elements includes:
generating a first and a second control word from the first and second feedback signals respectively, with each of the control words causing lock of the delay-locked loop and being selected from a range of control words with each of the control words resulting in the adjustable delay elements being set with a specific DLL delay time; and the first and second control words locking the delay-locked loop;
recording the first and second control words;
establishing a substantially linear relationship between the range of control words and the range of DLL delay times; and
using the substantially linear relationship to convert the first and the second control words to a first and a second DLL delay time; calculating a delay time difference between the first and second DLL delay times with the delay time difference being substantially equal to the array delay time of the array delay element.

11. The method according to claim 10, wherein establishing a substantially linear relationship includes:
generating the clock signal with no delay with a first clock edge; delaying the clock signal with the adjustable delay line to generate a first reference signal with a first reference edge; comparing the first clock and the first reference edges to provide a third feedback signal to lock the delay-lock loop at a third DLL delay time;
delaying the clock signal with a clock delay line having at least 1 adjustable delay element to provide a delayed clock with a second clock edge; further delaying the clock signal with the adjustable delay line to generate a second reference signal with a second reference edge; comparing the second clock and the second reference edges to provide a fourth feedback signal to lock the delay-lock loop at a fourth DLL delay time; and
using the first and second feedback signals and the third and fourth DLL delay times to define a substantially linear relationship between a range of DLL delay times and a range of the feedback signals.

12. The method according to claim 7, wherein the delaying of the selected one of the clock and the reference signals through the array delay line further includes further includes delaying the clock signal through a first array delay line having a first plurality of array delay elements of a phase detector array and delaying the reference signal through a second array delay line having a second plurality of array delay elements of the phase detector array, with the phase detector array being operable to measure phase jitter.

13. The method according to claim 7, wherein the clock and reference edges are a selected one of rising edges or falling edges.

14. A method comprising:
generating a clock signal with no delay and a first clock edge; delaying the clock signal with a delay-locked loop having a first delay line with a plurality of adjustable delay elements to generate a first reference signal with a first reference edge; comparing the first clock and the first reference edges to provide a first feedback signal to lock the delay-lock loop at a first adjustable delay;
delaying the clock signal with a second delay line having at least 1 adjustable delay element to provide a delayed clock with a second clock edge; further delaying the clock signal with the first delay line to generate a second reference signal with a second reference edge; comparing the second clock and the second reference edges to provide a second feedback signal to lock the delay-lock loop at a second adjustable delay; and
using the first and second feedback signals and the first and second adjustable delays to define a substantially linear relationship between a range of adjustable delays and a range of the feedback signals.

15. The method according to claim 14, wherein using the first and second feedback signals and the first and second adjustable delays to define a substantially linear relationship includes generating a first and a second control word from the first and second feedback signals respectively, with each of the control words being selected from a range of control words and resulting in the adjustable delay elements being set with a specific adjustable delay; and recording the first and second control words.

16. The method according to claim 15, wherein using the first and second feedback signals and the first and second adjustable delays to define a substantially linear relationship further includes defining a first point of the linear relationship based upon the first word and the first adjustable delay and a second point of the linear relationship based upon the second word and the second adjustable delay to define a line segment; and extrapolating the line segment to extend over the range of adjustable delays and the range of control words.

17. The method according to claim 16, wherein the comparing of the first clock and the first reference edges to provide the first feedback signal includes using a selected phase detector; and the comparing of the second clock and the second reference edges to provide the second feedback signal includes using the selected phase detector.

18. An apparatus, comprising:
a phase detector array including an array delay line with a plurality of array delay elements; a non-delay line; and a first and a second phase detector being coupled to the array delay line on opposed sides of each of the array delay elements and coupled to the non-delay line;
a clock generator to generate a clock signal with a clock edge;
a delay-locked loop, coupled to the clock generator and having an adjustable delay line, to generate a reference signal with a reference edge in response to the clock signal;
a selected one of the clock generator and the adjustable delay line coupled to the array delay line and the other one coupled to the non-delay line;
for each of the array delay elements, the first and second phase detectors being operable to compare the clock and reference edges to generate a first and a second feedback signal to twice adjust the adjustable delay line so that the clock and reference edges are twice aligned.

19. The apparatus according to claim 18, wherein the phase detector array and the delay-locked loop are within an integrated circuit chip with the clock generator being external to and coupled to the integrated circuit chip and the phase detector array is operable to measure phase jitter.

20. The apparatus according to claim 19, further comprising a phase detector selector operable to couple the first and second phase detectors one at a time to the feedback path, with the phase detector being coupled to the feedback path being defined as a selected phase detector.

21. The apparatus according to claim 20, wherein the feedback loop includes a counter to generate a first and a second control word in response to the first and the second feedback signals respectively and a calibration recorder coupled to the feedback loop to record the first and second control words.

22. The apparatus according to claim 21, wherein the adjustable delay line includes a plurality of adjustable delay elements providing the adjustable delay with each adjustable delay element being settable to an adjustable delay time selected from a range of adjustable delay times; and further comprising a processor coupled to the calibration recorder and operable to determine the array delay time of each of the array delay element in response to the first and second control words.

23. The apparatus according to claim 22, wherein each of the control words causes lock of the delay-locked loop and are selected from a range of control words with each of the control words resulting in the adjustable delay elements being set with a specific adjustable delay time; the range of control words and the range of adjustable delay times having a substantially linear relationship; and the processor being operable to convert the first and the second control words with the substantially linear relationship to a first and a second adjustable delay time; calculating a delay time difference between the first and second adjustable delay times with the delay time difference being substantially equal to the array delay time of the array delay element.

24. The apparatus according to claim 23, wherein the feedback path includes a low-pass filter coupled between one of the selected phase detectors and the counter.

25. The apparatus according to claim 23, wherein the phase delay detector a first array delay line having a first plurality of array delay elements coupled to a clock signal and a second array delay line having a second plurality of array delay elements coupled to the reference signal.

26. The apparatus according to claim 23, wherein the clock and reference edges are a selected one of rising edges or falling edges.

27. A system, comprising:
a clock generator to generate a clock signal with a clock edge;
an integrated chip coupled to the clock generator, including a reference generator, responsive to the clock signal, to generate a reference signal having an adjustable reference edge relative to the clock edge; a phase detector array having an array delay line with a plurality of delay elements and a selected one of the clock and reference generators being coupled to the array delay line; a first and a second phase detector coupled to the array delay line on opposed sides of each of the delay elements and to the other one of the clock and reference generators to generate a first and a second feedback signal; a feedback path coupled between the phase detectors one at a time and the reference generator; and the reference generator operable for each of one or more of the delay elements to adjust the reference edge with a first delay and a second delay relative to the clock edge in response to the first and the second feedback signals respectively; and a test-access-port instrument coupled to the integrated chip.

28. The system according to claim 27, wherein the reference generator includes an adjustable delay line operable to adjust the reference edge with the first and the second delays in response to the first and the second feedback signals respectively and the phase detector array is operable to measure phase jitter.

29. The system according to claim 28, further comprising:

a processor coupled to the feedback path and responsive to the first and the second feedback signals to determining a array delay of each of the delay elements.

30. The system according to claim 29, wherein the feedback path generates a control word selected from a range of control words in response to each of the feedback signals and the first and second delays are in a range of adjustable delays; the processor being operable to define a substantially linear relationship between the range of control words and the range of adjustable delays and to generate and store a first control word in responsive to the first feedback signal and to generate and store a second control word in response to the second feedback signal and to use the substantially linear relationship to convert the first and the second control words to a delay difference substantially equal to the array delay of each of the delay elements.

* * * * *

UNITED STATES PATENT AND TRADEMARK OFFICE
CERTIFICATE OF CORRECTION

PATENT NO. : 7,024,324 B2
APPLICATION NO. : 10/856907
DATED : April 4, 2006
INVENTOR(S) : Rifani et al.

It is certified that error appears in the above-identified patent and that said Letters Patent is hereby corrected as shown below:

Title Page;
FIG. 9
Block 122, ". . . DETECTOR ARRY" should read -- . . . DETECTOR ARRAY --.

Column 5
Lines 54, 57, 59, 61-61, 66, and 67, ". . . delay element 44 or 46 . . ." should read -- . . .delay element 42 or 44 . . . --.

Column 6
Line 67 ". . . feedback loop 60, . . ." should read -- . . . feedback loop 60, . . . --.

Column 7
Line 1, ". . . feedback loop 60, . . ." should read -- . . . feedback loop 60, . . . --.

Column 9
Line 3, ". . . delay lines 58 and 83 . . ." should read -- . . . delay lines 58 and 82 . . . --.

Column 10
Line 66, " . . . and the DLL . . ." should read -- . . . and at a block 114, the DLL . . . --.

Column 14
Line 15, ". . . multiplexer 142 . . ." should read -- . . . multiplexer 144 . . .--.

Column 17
Line 3, ". . . further includes further includes . . ." should read -- . . . further includes . . . --.

Column 20
Line 4, ". . . a array delay . . ." should read -- . . . an array delay . . . --.
Line 15, ". . . in responsive to . . ." should read -- . . . in response to . . . --.

Signed and Sealed this

Twenty-sixth Day of June, 2007

JON W. DUDAS
*Director of the United States Patent and Trademark Office*